United States Patent
Kunze

(10) Patent No.: US 11,067,796 B2
(45) Date of Patent: Jul. 20, 2021

(54) INFORMATION DISPLAY SYSTEM FOR A VEHICLE

(71) Applicant: MAGNA ELECTRONICS INC., Auburn Hills, MI (US)

(72) Inventor: Norbert Kunze, Diez (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 991 days.

(21) Appl. No.: 15/432,950

(22) Filed: Feb. 15, 2017

(65) Prior Publication Data

US 2017/0235137 A1  Aug. 17, 2017

Related U.S. Application Data

(60) Provisional application No. 62/295,571, filed on Feb. 16, 2016.

(51) Int. Cl.
*G02B 27/01* (2006.01)
*H05K 7/20* (2006.01)

(52) U.S. Cl.
CPC ......... *G02B 27/0101* (2013.01); *G02B 27/01* (2013.01); *G02B 27/0149* (2013.01); *H05K 7/20163* (2013.01); *G02B 2027/014* (2013.01); *G02B 2027/0138* (2013.01); *G02B 2027/0154* (2013.01)

(58) Field of Classification Search
None
See application file for complete search history.

(56) References Cited

U.S. PATENT DOCUMENTS

| | | | |
|---|---|---|---|
| 5,550,677 A | 8/1996 | Schofield et al. | |
| 5,670,935 A | 9/1997 | Schofield et al. | |
| 5,949,331 A | 9/1999 | Schofield et al. | |
| 6,827,130 B2 * | 12/2004 | Larson | H01L 21/4878 165/185 |
| 7,161,803 B1 * | 1/2007 | Heady | H05K 7/2099 165/104.33 |
| 8,427,751 B2 | 4/2013 | Rumpf et al. | |
| 8,953,247 B2 * | 2/2015 | Rumpf | G02B 7/005 345/7 |
| 9,405,120 B2 | 8/2016 | Graf et al. | |
| 10,241,365 B2 * | 3/2019 | Pierre | G02B 19/0066 |
| 2014/0104426 A1 * | 4/2014 | Boegel | B60R 1/00 348/148 |
| 2015/0092042 A1 | 4/2015 | Fursich | |
| 2015/0232030 A1 | 8/2015 | Bongwald | |
| 2015/0296135 A1 | 10/2015 | Wacquant et al. | |
| 2016/0209647 A1 | 7/2016 | Fursich | |
| 2017/0153457 A1 | 6/2017 | Kunze | |

* cited by examiner

*Primary Examiner* — Christopher Stanford
*Assistant Examiner* — Journey F Sumlar
(74) *Attorney, Agent, or Firm* — Honigman LLP

(57) ABSTRACT

A display system of a vehicle includes a display device disposed in the vehicle and operable to display heads up information for viewing by a driver of the vehicle. The display device includes a mirror, a display screen and a cooling device. The mirror is pivotally mounted at a base plate and is pivotable via a pin of a mounting arm of the mirror moving along a spiral groove of a gear element when the gear element is rotated. The pin is urged towards a side wall of the spiral groove to limit play of the mirror relative to the base plate.

20 Claims, 10 Drawing Sheets

INFORMATION DISPLAY SYSTEM FOR A VEHICLE

CROSS REFERENCE TO RELATED APPLICATION

The present application claims the filing benefits of U.S. provisional application Ser. No. 62/295,571, filed Feb. 16, 2016, which is hereby incorporated herein by reference in its entirety.

FIELD OF THE INVENTION

The present invention relates generally to a vehicle vision and display system for a vehicle and, more particularly, to a vehicle system that utilizes one or more cameras at a vehicle and that displays images for viewing by the driver of the vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. It is also known to provide a display in the vehicle for displaying images for viewing by a driver of the vehicle during operation of the vehicle. Known automotive head up displays typically have a foldable main mirror that is propelled by an actuator. A display or projector is present to generate a source image. The display is assembled in front of an optical bench of mirrors and optional lenses to project an image to the driver's view. Such displays typically generate a substantial amount of heat that makes passive or active cooling necessary. Examples of head up displays are described in U.S. Pat. Nos. 9,405,120; 8,953,247 and/or 8,427,751, which are hereby incorporated herein by reference in their entireties.

SUMMARY OF THE INVENTION

The present invention provides a driver assistance system or display system or imaging system for a vehicle that utilizes one or more cameras (preferably one or more CMOS cameras) to capture image data representative of images exterior of the vehicle, and provides a head up display that displays images or information for viewing by the driver of the vehicle. The head up display comprises a main mirror that is pivotable via actuation of a gear element, whereby a pin of a mounting arm of the mirror slides along a groove or channel of the gear element to cause pivotal movement of the mirror, with a biasing element that biases or urges the pin against a wall of the groove or channel to limit play of the pin and thus the mirror relative to the base plate. The gear element may also be tensioned towards engagement with teeth of a drive gear of a motor, to further limit play of the gear element and thus the mirror. The head up display includes a display screen holder that is pivotally attached at the base plate via a hook and clasp configuration. The head up display also includes a cooling device that has a cooling body, which provides enhanced cooling of the display device via a cooling body received at a cooling can housing attached at the display screen backlight, with the folded configuration of a heat plate in the can housing cooling the ends of the heat plate and cooling the cooling body that receives the ends of the heat plate.

These and other objects, advantages, purposes and features of the present invention will become apparent upon review of the following specification in conjunction with the drawings.

BRIEF DESCRIPTION OF THE DRAWINGS

FIG. 8 is an enlarged perspective view of the portion of the head up display unit of FIG. 6, showing use of two sideward clips that interface with the baseplate behind which these snap in;

LEGEND

Figure 1:
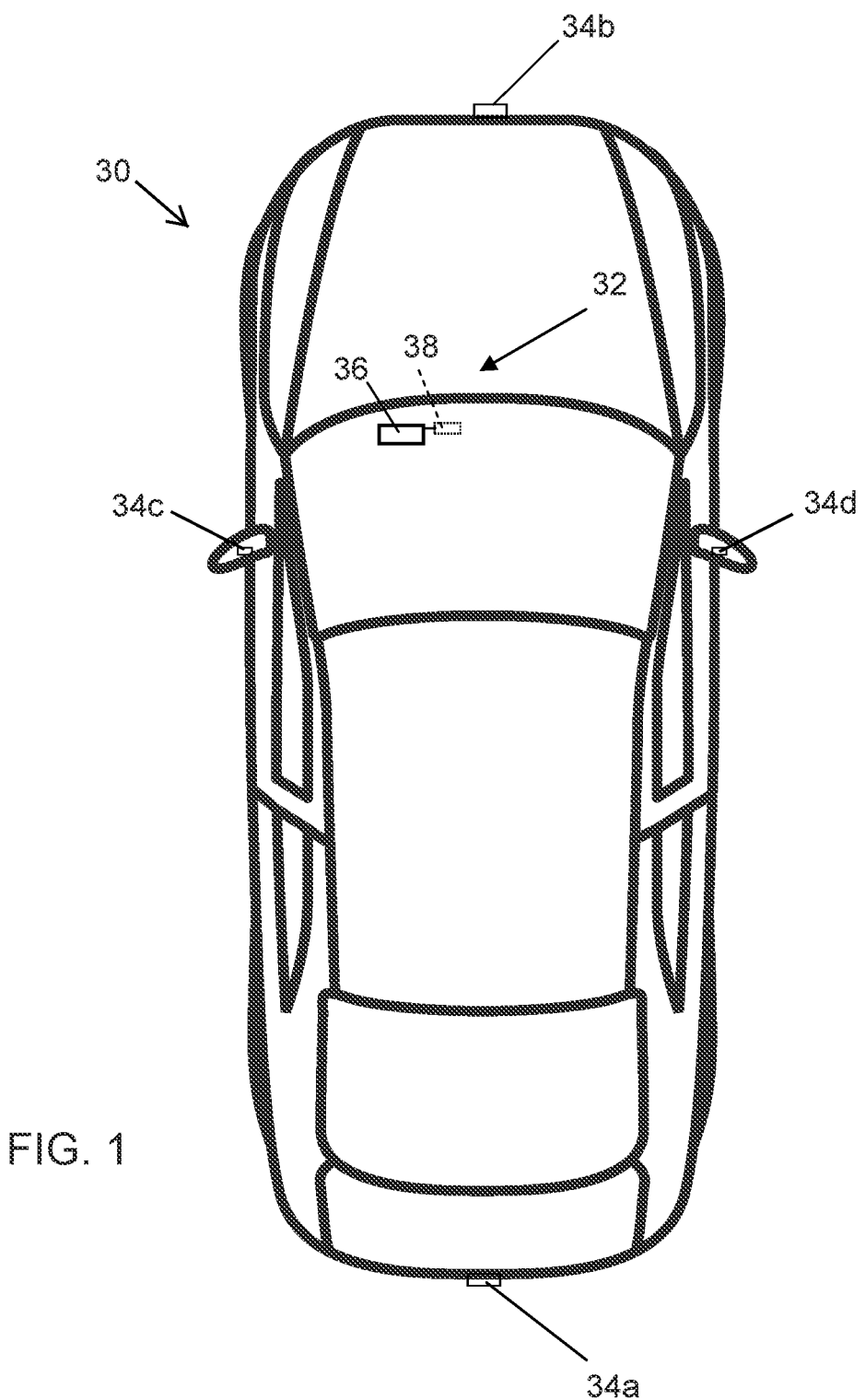
FIG. 1 is a plan view of a vehicle with a display system that incorporates cameras and a head up display unit in accordance with the present invention.

1 lever arm
2 hook on lever arm
3 spring
4 hook on base plate
5 base plate
6 spiral groove
7 gear wheel
8 pin
9 main mirror
10 folding motor
11 worm gear
12 claw coupling
13 cooling can
14 gear bracket
15 gear wheel spring
16 TFT holder
17 TFT holder hooks
18 clips
19 clasp
20 TFT
21 cooling body
22 sealing
23 slot
24 heat plate
25 groove
26 bead
27 fan
28 spring
30 vehicle 32 vision/display system
34a-d cameras
36 display device
38 control
39 motor holder
40a-b main mirror bearings
41 base plate's edges at which main mirror clips in.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. The vision system provides a display, such as a rearview display or a top down or bird's eye or surround view display or the like, for viewing by the driver of the vehicle.

Referring now to the drawings and the illustrative embodiments depicted therein, a vehicle 30 includes an imaging system or vision system or display system 32 that includes a display device 36 and optionally at least one exterior facing imaging sensor or camera, such as a rearward facing imaging sensor or camera 34a (and the system may optionally include multiple exterior facing imaging sensors or cameras, such as a forwardly facing camera 34b at the front (or at the windshield) of the vehicle, and a sidewardly/rearwardly facing camera 34c, 34d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like).

The vision system 32 includes a control or electronic control unit (ECU) or processor 38 that is operable to process image data captured by the camera or cameras and may detect objects or the like and/or provide displayed images at the display device 36 for viewing by the driver of the vehicle. The display device 36 comprises a head up display device that is operable to project images for viewing by the driver of the vehicle during normal operation of the vehicle, as discussed below. The data transfer or signal communication from the camera to the ECU may comprise any suitable data or communication link, such as a vehicle network bus or the like of the equipped vehicle.

The display device may utilize aspects of the display devices described in U.S. Pat. Nos. 9,405,120; 8,953,247 and/or 8,427,751, and/or U.S. Publication Nos. US-2016-0209647; US-2015-0296135; US-2015-0232030 and/or US-2015-0092042, which are hereby incorporated herein by reference in their entireties.

The head up display device or unit 36 comprises a main mirror 9, a display screen 20 (such as a thin film transistor (TFT) backlit display screen or the like) and a cooling device 13. The main mirror may be adjustably positioned and adjusted to adjust an optical path between the display screen and the driver's eyes, such as by utilizing aspects of the display systems described in U.S. patent application Ser. No. 15/364,354, filed Nov. 30, 2016, which is hereby incorporated herein by reference in its entirety.

Figure 2:
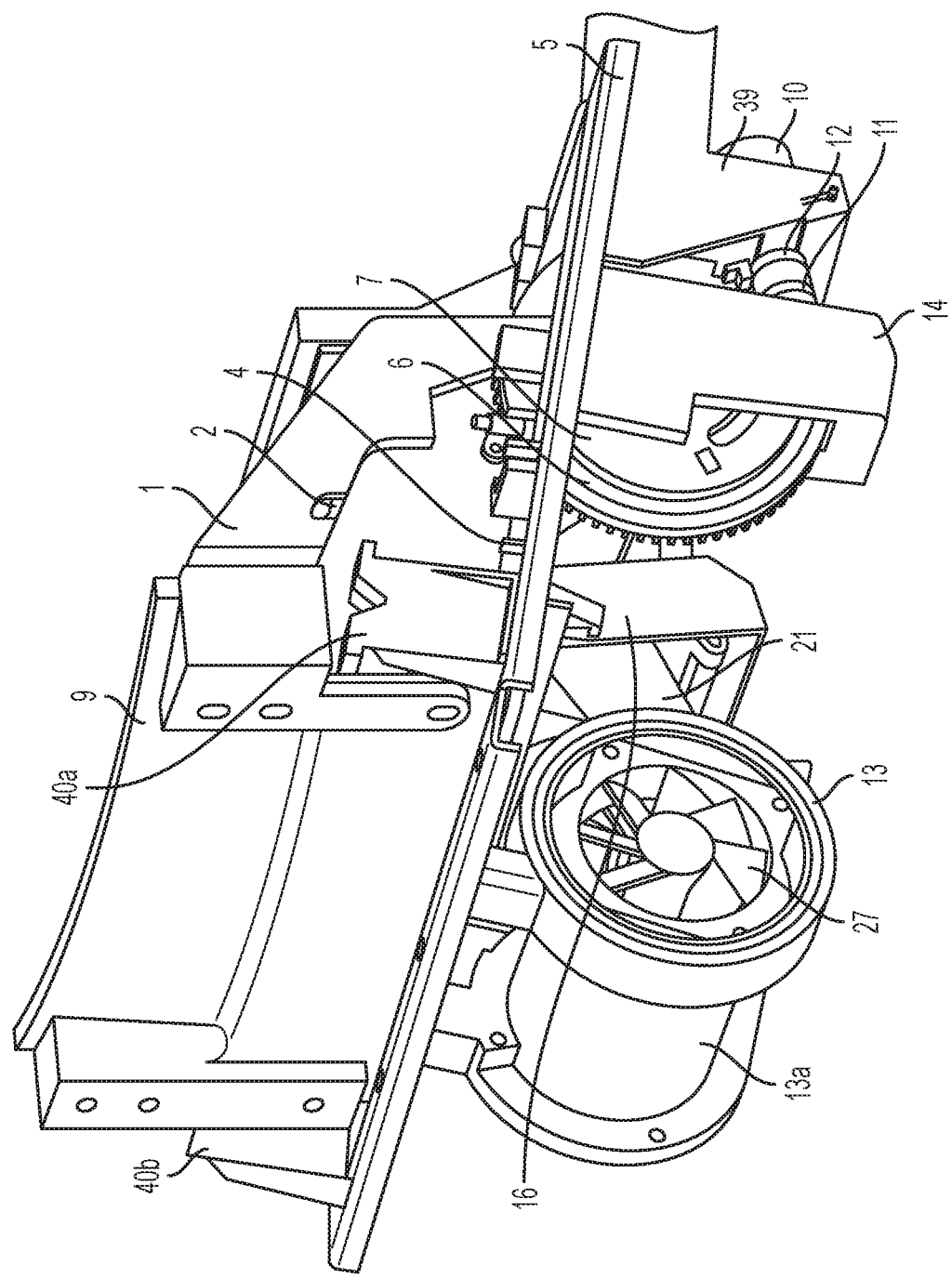
FIG. 2 is a perspective view of the head up display unit of the present invention.
Figure 3:
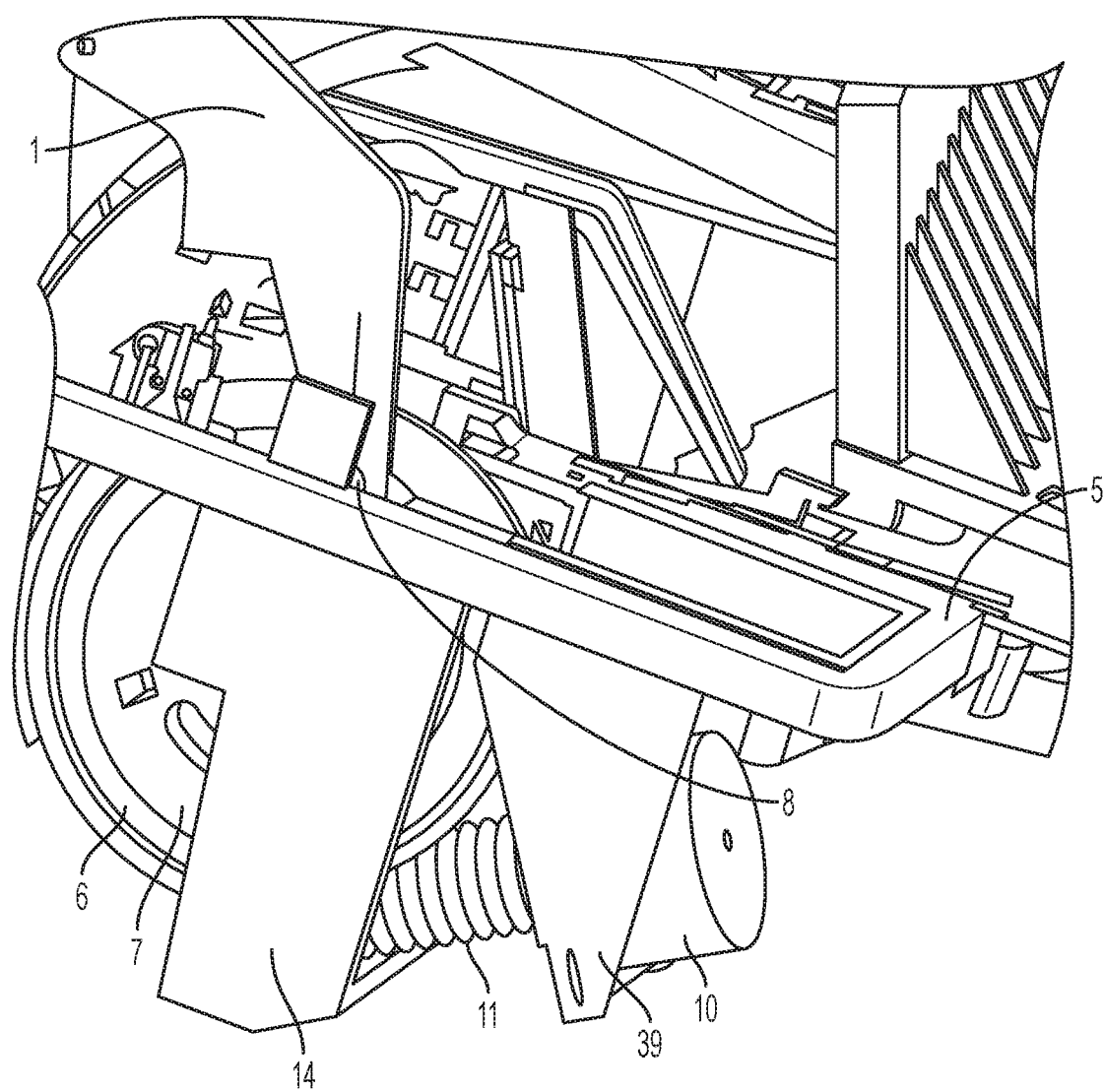
FIG. 3 is another perspective view of a portion of the head up display unit of FIG. 2.
Figure 4:
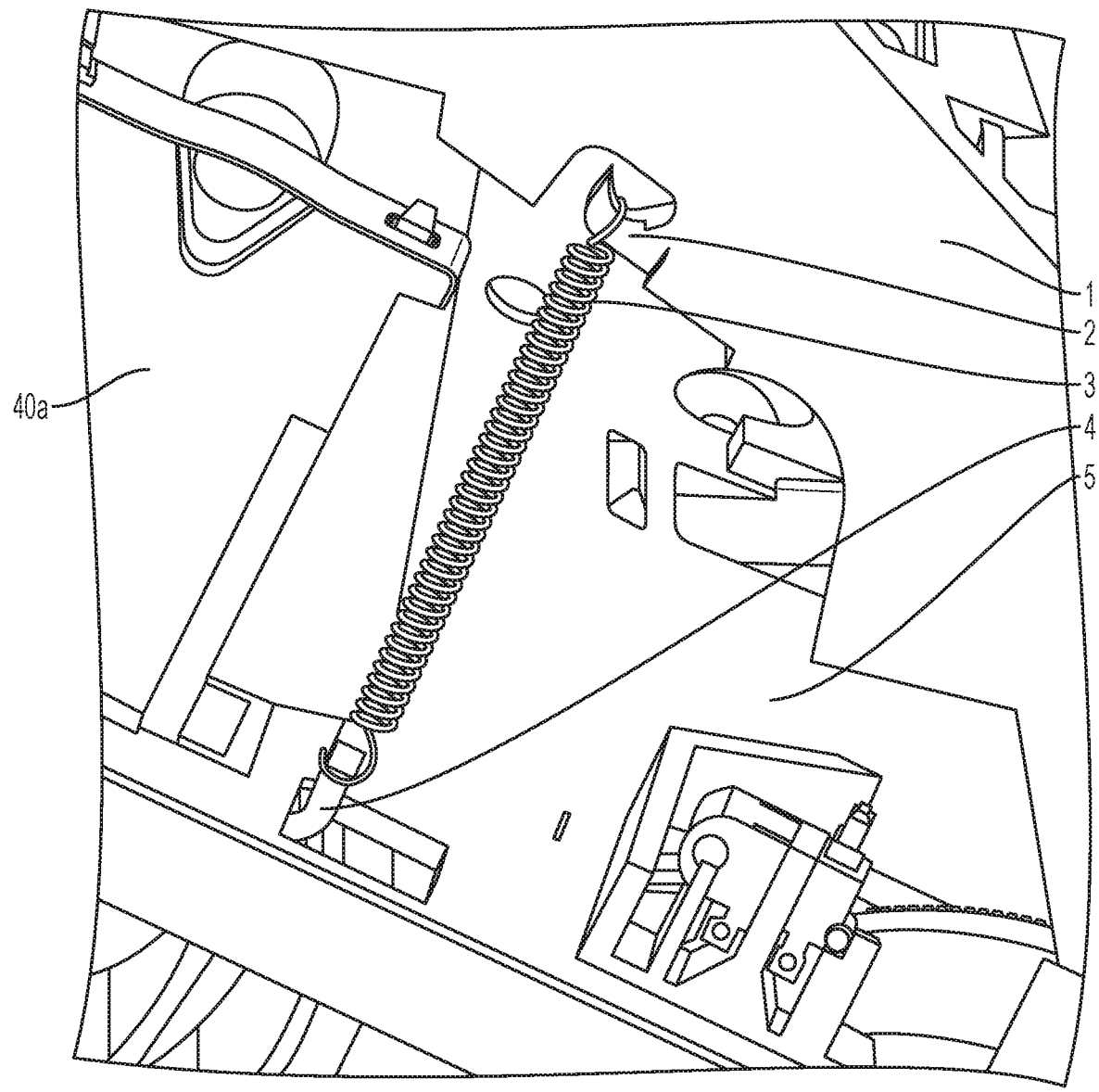
FIG. 4 is a perspective view of a portion of a head up display unit of the present invention, showing use of a spring that limits movement of the mirror.

As shown in FIGS. 2 and 3, the main mirror 9 includes a lever arm 1 with a pin 8 at its end, with the pin received in and traveling or running in and along a spiral groove 6 of a gear wheel or gear element 7 for extracting or retracting the main mirror when the gear wheel is rotated. For example, as the gear element 7 is rotated in one direction, the pin may travel along the groove and move towards the axis of rotation of the gear element (due to the spiral nature of the groove), while the pin may move away from the axis of rotation of the gear element when the gear element is rotated in the opposite direction. A little amount of play between the groove and the pin reduces friction forces and vibration due to skipping as the pin moves along the groove when the gear element is rotated. To limit or hinder the main mirror from moving or toggling within the tolerances or play, the main mirror's lever arm includes an elastic element 3 that biases or urges the lever arm and pin in one direction (such as radially inward in the illustrated embodiment) so as to urge the pin against one side wall of the groove of the gear element. One example is shown in FIG. 4, which shows the elastic element 3 as a spring, which is attached at one end to the lever arm 1 (that has pin 8 at an end thereof) and at the other end to the head up display's base plate 5, thereby applying a pretension to the lever arm pin to urge the pin radially inward against a wall of the spiral groove.

Figure 5:
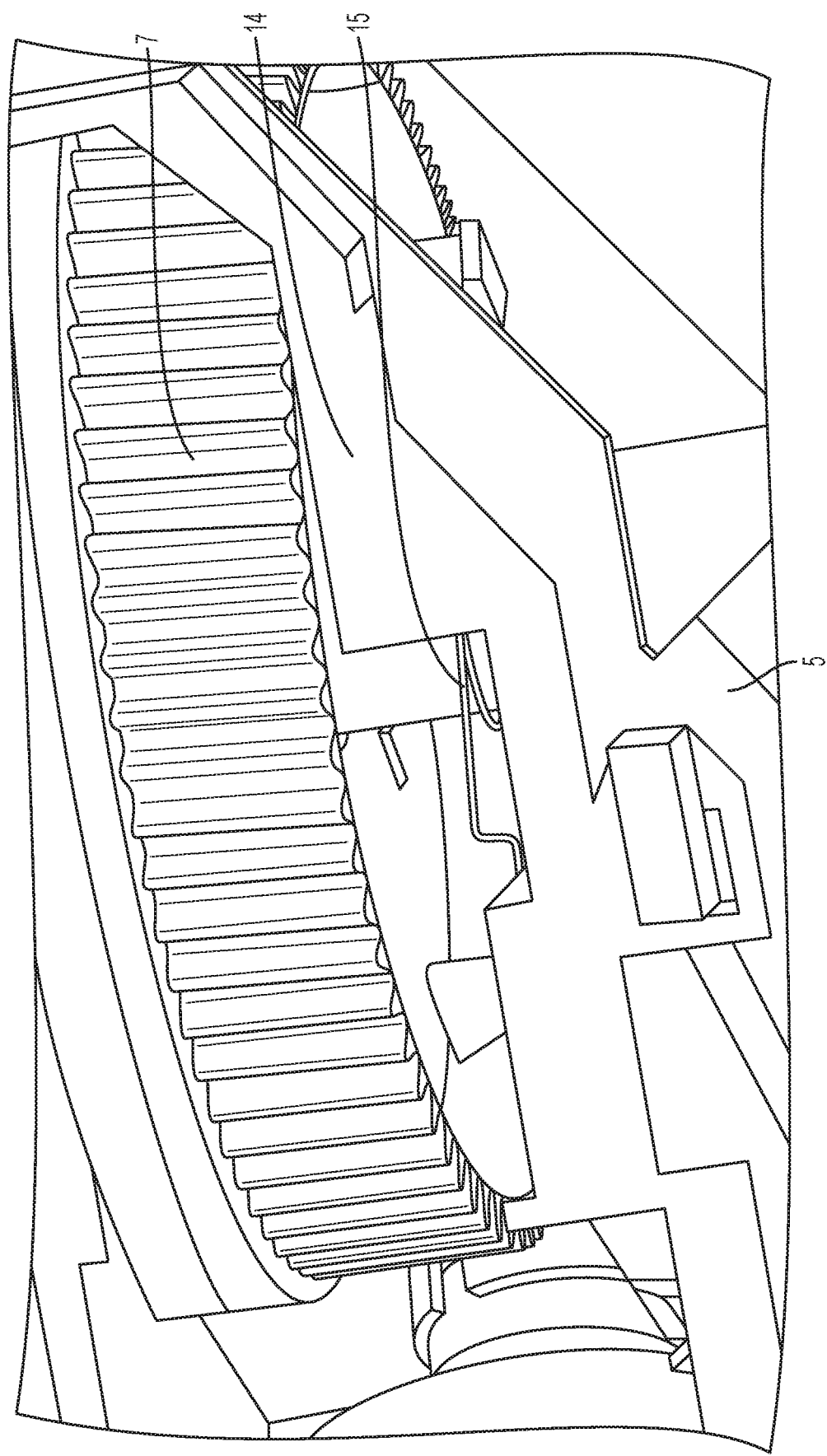
FIG. 5 is a perspective view of a portion of a head up display unit of the present invention, showing use of a tensioned gear wheel spring that limits play between a worm gear and the gear wheel.

The gear wheel 7 is driven by the folding motor 10, which has a worm gear 11 that is attached to the folding motor by a claw coupling 12, such as shown in FIGS. 2 and 3. To reduce or limit or prevent play between the worm gear and the gear wheel's tooth, a gear wheel spring 15 is attached to the gear and tensioned against or relative to the gear bracket 14, such as shown in FIG. 5. The wheel spring 15 gets wound up when the gear wheel is turning in one direction and unwound when the gear wheel turns in the other direction. A low momentum is thus always applied to the gear element. The momentum to the gear causes a permanent force to the applied worm gear in an outward direction, which limits longitudinal play against its motor bearing.

Optionally, instead of having screwed or clipped on parts, the base plate may have outsert or insert injection molded plastic parts (done by an outsert or insert molding process) which reduces the necessary assembly steps. For example, the component's gear bracket 14, the motor holder 39 and the main mirror bearings 40a and 40b may be done by outsert molding.

Figure 6:
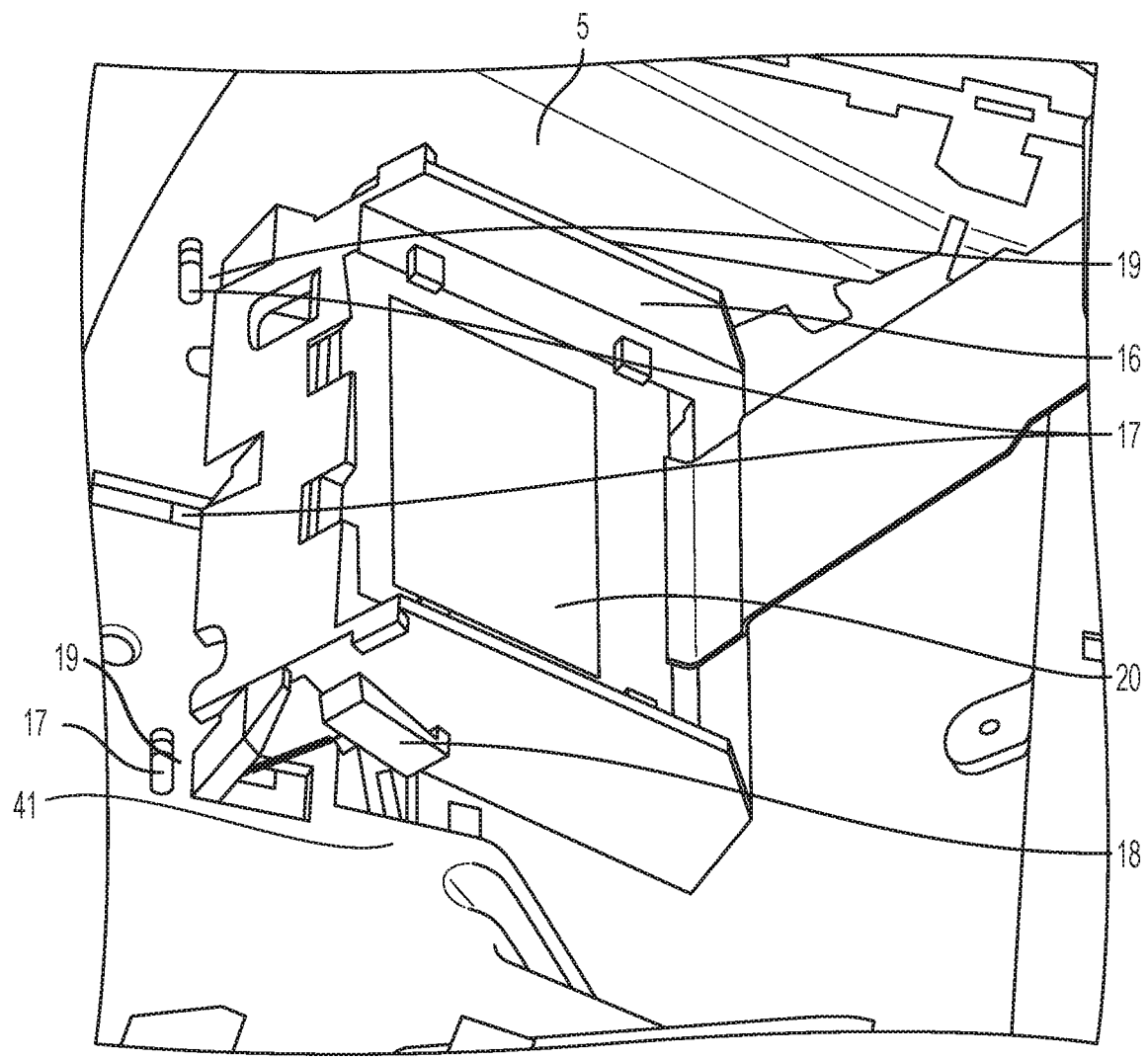
FIG. 6 is a perspective view of a portion of a head up display unit of the present invention, showing use of a TFT holder at a base plate of the display unit.
Figure 7:
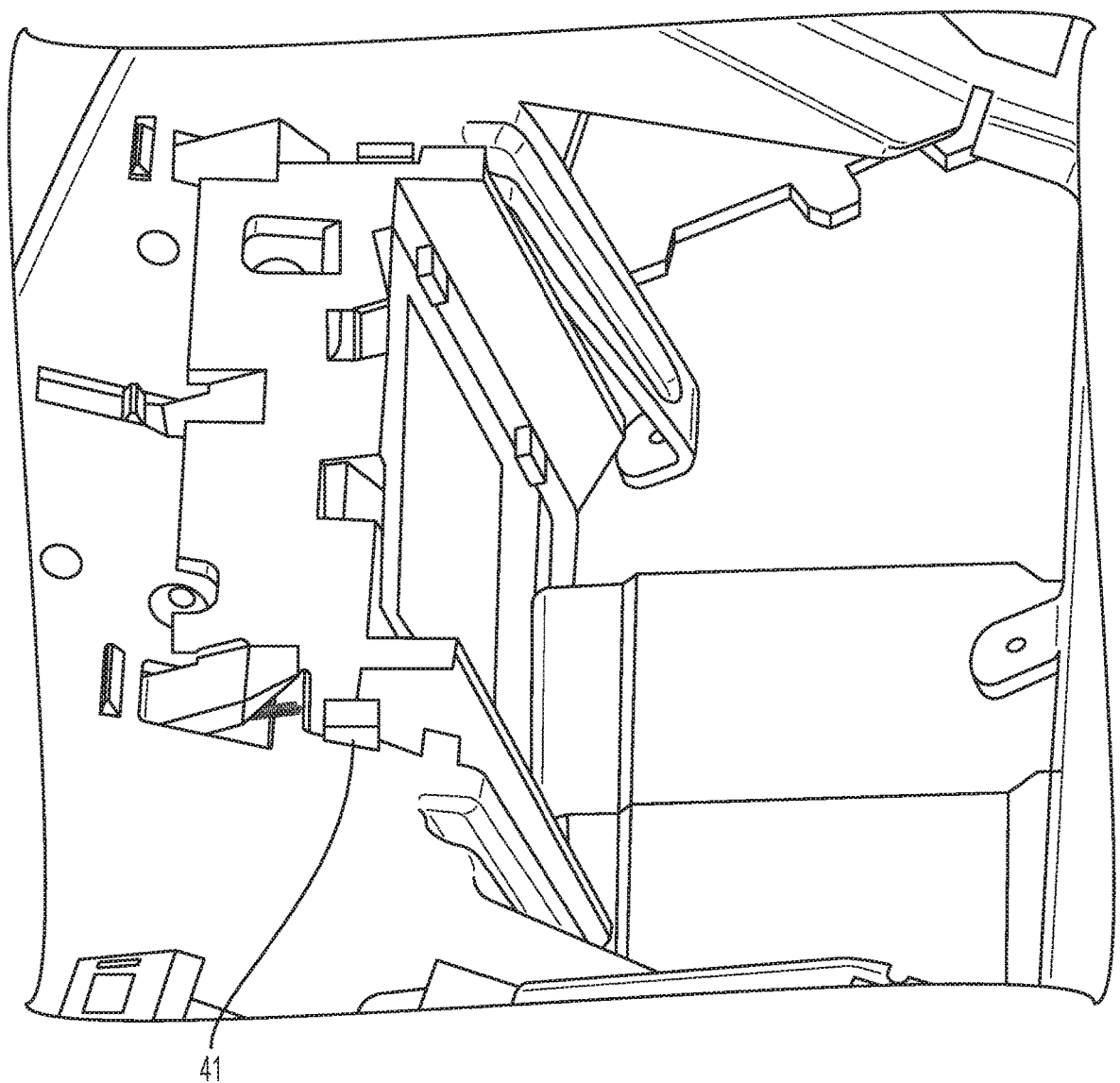
FIG. 7 is a perspective view of a portion of the head up display unit of FIG. 6, showing rotation around the hooks contact point's axis.
Figure 8:
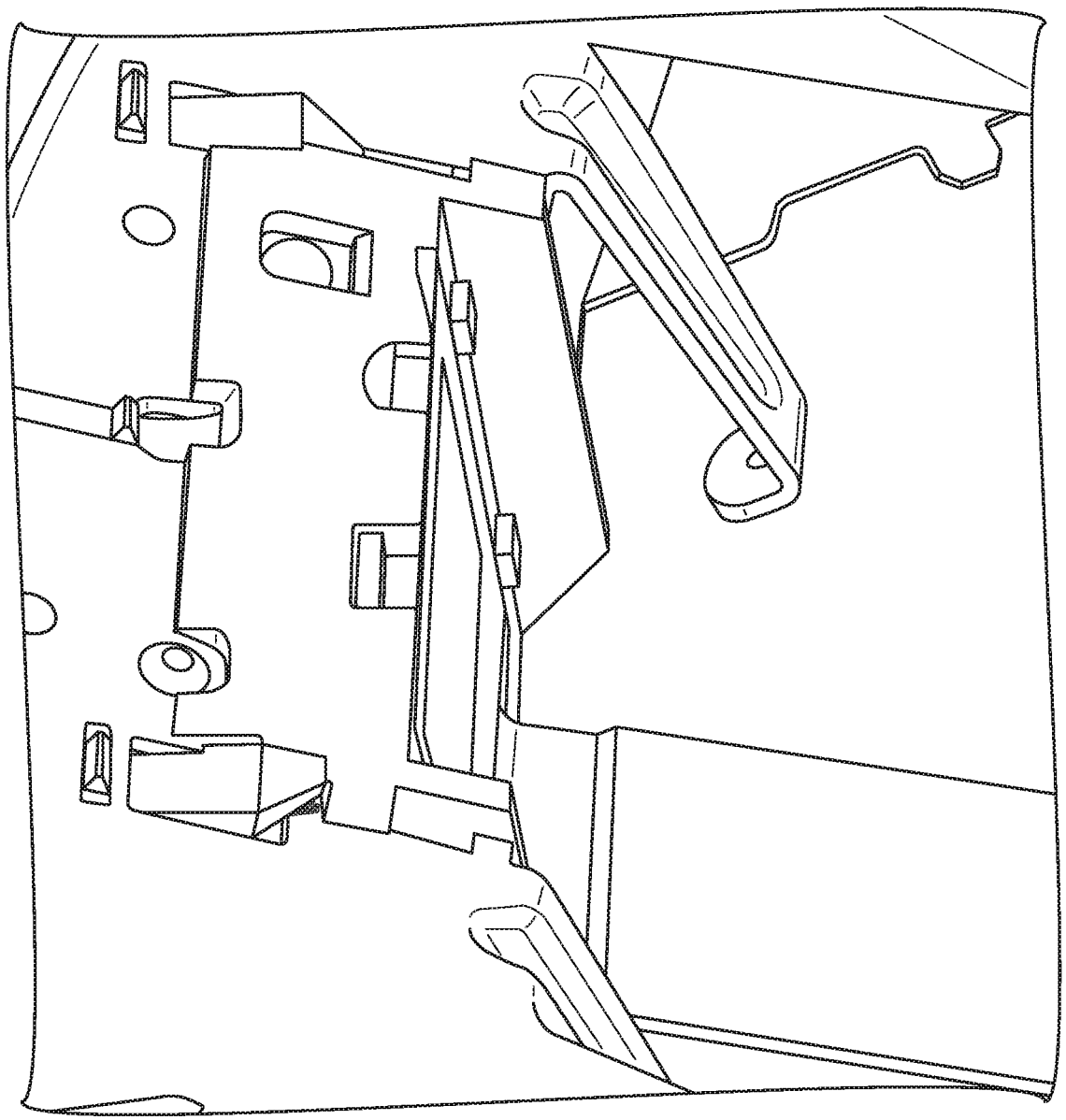

The display device of the present invention also comprises the display screen or TFT display holder 16, which is applied to the base plate 5 by three hooks 17 at clasps 19 of the base plate (see FIG. 6), with rotation of the holder around the hooks contact point's axis (FIG. 7). Such rotation of the holder brings two sideward clips 18 into interface with the base plate's edges 41, behind which the clips snap in (FIG. 8). The remaining tension ensures that the connection is fixed or secured with reduced or limited or no play.

Figure 9:
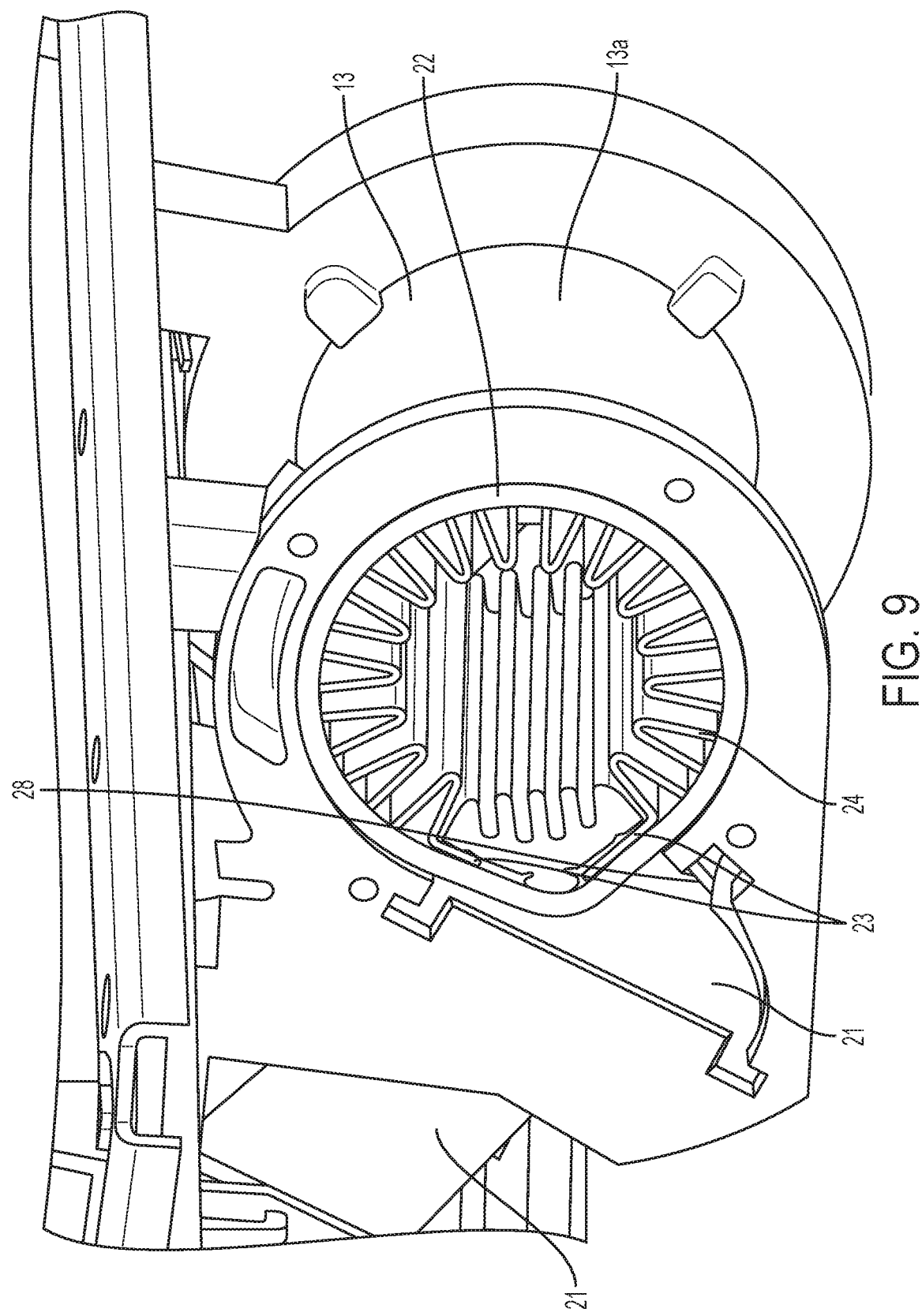
FIG. 9 is a perspective view of a cooling device of the head up display unit of the present invention.
Figure 10:
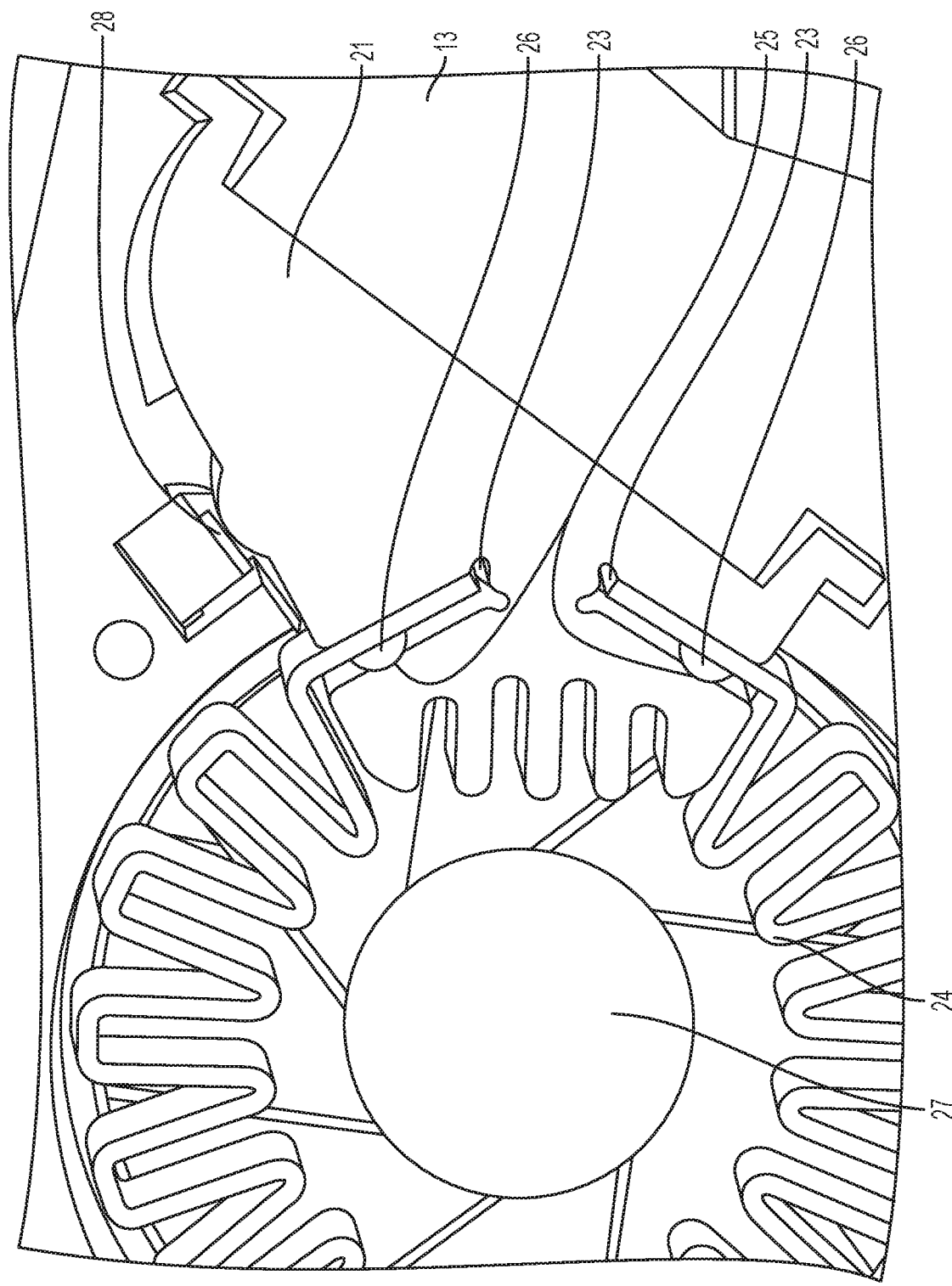
FIG. 10 is an end elevation of the cooling device of FIG. 9.

The display device of the present invention also comprises a TFT backlight cooling device 13. As shown in FIGS. 2, 9 and 10, the cooling device 13 includes a cooling body 21 that is inserted to a cooling can housing 13a, which is attached at the TFT backlight (at or behind the TFT holder 16), optionally with an additional thermal flow compound in between. As shown in FIGS. 9 and 10, the cooling body 21 has an end portion that is received in a portion of the can housing with a contour that generally matches the receiving portion of the can housing so as to be limited or prevented from moving sideward relative to the housing. After a spring 28 is applied between the cooling can housing 13*a* and the cooling body 21 (FIG. 10), the cooling body is fixated relative to the housing. As best shown in FIGS. 9 and 10, the cooling body comprises a finned portion that is received within the can housing and the cooling body includes two outwardly extending slots 23 which have an angle to receive end portions or tabs of a heat plate 24 for furtherly distributing heat from the TFT backlighting. A groove 25 in each slot allows for absorbing or receiving two beads 26, which fixate the heat plates and enlarges the surface interface for heat transition. Additionally, elevated contact forces further improve the thermal conductivity.

For enlarging the effective surface, and such as shown in FIGS. 9 and 10, the heat plate 24 is folded or formed in a zigzag loop from one end (received in one slot of the cooling body) to the other end (received in the other slot of the cooling body). The cooling body 21 also includes a finned portion between the opposite ends of the zigzag heat plate. Besides convection, the heat dissipation air flow will be boosted by a fan 27 disposed within or substantially circumscribed by the zigzag loop of the heat plate 24. Due to the unusual inbound zigzag fold of the heat plate within the can housing (and around the fan), the air passes the heat plate not just at one side but along the top and the bottom sides, which increases the heat dissipation effectiveness.

Due to the longitudinal continuity, it is possible to comprise the cooling body 21 as a rod pressing member, which makes this part cheaper than having it done by die casting. The cooling body may be preferably formed of Aluminum or alternatively Zinc or another suitable metal or ceramic or sintered material or the like. Due to its effective heat distribution, it may be possible to assemble the cooling can out of a mold instead of metal, which reduces costs, weight and improves design freedom.

Therefore, the present invention provides a head up display device that includes a mirror 9 that pivots via a pin 8 of its mounting arm or lever arm 1 (pivotally mounted at the base plate 5) traveling along a spiral path 6 of a gear element 7 that is rotated about an axis via a motor 10 (that is mounted at the base plate 5 via a bracket or motor holder 39). As the gear element 7 is rotated, the pin moves radially towards or away from the axis via traveling along the spiral groove or path to pivot the lever arm 1 to pivot or adjust the mirror 9. The pin is biased (via a biasing element or spring 3 disposed between a hook 2 on the lever arm 1 and a hook 4 on the base plate 5) toward one side wall of the groove or path to limit play or wobble of the mirror. The gear element 7 is biased or urged or tensioned (such as via a spring or torsional spring or wound spring 15 or the like) in one direction to maintain engagement with the teeth of the drive gear or worm gear 11 of the motor 10 to also limit play of the gear element 7 and thus play of the mirror.

The display screen 20 (such as a thin film transistor (TFT) display screen backlit by a plurality of light emitting diodes (LEDs) or the like) is mounted at the base plate 5 via a display holder 16, which clips onto the base plate (via clips and clasps 17, 18, 19) to allow for pivotal movement of the display holder and display screen relative to the base plate.

The display device also includes the cooling device, which provides enhanced cooling of the display screen. The cooling device includes a cooling body 21 received at a cooling can housing 13 attached at the base plate 5. The cooling can 13 has a housing 13*a* that is, in the illustrated embodiment, a cylindrical housing. The housing houses a fan 27 and a heat plate 24, which is a zigzag configuration element disposed within the inner surface of the housing, with its ends received in respective slots 23 of the cooling body 21. The cooling body is formed so as to be received in a correspondingly shaped recess of the cooling can 13, and may be biased into contact with the cooling can via a biasing element or spring 28. The cooling body 21 includes a finned portion that is received in the cooling can housing 13*a* and between opposite end regions of the zigzag heat plate 24. The cooling body 21 extends from the cooling can 13 to contact or be in thermal connection with the TFT backlight, whereby heat is transferred from the backlight to the heat plate via the cooling body 21, with the folded configuration of the heat plate in the can housing cooling the ends of the heat plate and cooling the cooling body that receives the ends of the heat plate.

The display device is operable to display information or images, such as video images derived from image data captured by one or more cameras of the vehicle. Optionally, the vision system (such as by utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. Publication No. US-2012-0162427, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EyeQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 8,694,224; 7,005,974; 5,760,962; 5,877,897; 5,796,094; 5,949,331; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 7,881,496; 7,720,580; 7,038,577; 6,882,287; 5,929,786 and/or 5,786,772, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Publication No. US-2012-0062743, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A display system of a vehicle, said display system comprising:
   a display device disposed in a vehicle and operable to display heads up information for viewing by a driver of the vehicle;
   said display device comprising a mirror, a display screen and a cooling device;
   wherein said display screen comprises a backlit display screen that is backlit by a backlight;
   wherein said mirror is pivotally mounted at a base plate and is pivotable via a pin of a mounting arm of said mirror moving along a spiral groove of a gear element when said gear element is rotated;
   wherein said pin is urged towards a side wall of said spiral groove to limit play of said mirror relative to said base plate;
   wherein said cooling device comprises a cooling body that draws heat from said backlight of said display screen;
   wherein said cooling body comprises a backlight portion that is in thermal connection with said backlight and a heat dissipating portion disposed in a cooling housing;
   wherein said cooling housing has a passageway therethrough, and wherein said heat dissipating portion of said cooling device is disposed in the passageway and said backlight portion of said cooling device is disposed outside of the passageway of said cooling housing;
   wherein said cooling device comprises a heat plate disposed in the passageway of said cooling housing and in thermal connection with said cooling body;
   wherein said heat plate is disposed along at least one wall of said cooling housing and partially circumscribes the passageway; and
   wherein terminal ends of said heat plate are in thermal connection with said heat dissipating portion of said cooling device.

2. The display system of claim 1, wherein said pin is urged towards a side wall of said spiral groove via a spring disposed between said base plate and said mounting arm.

3. The display system of claim 2, wherein said spring urges said pin towards a radially inward side wall of said spiral groove.

4. The display system of claim 1, wherein said gear element is tensioned in one direction to maintain engagement with the teeth of a drive gear that is driven by a motor to rotate said gear element to limit play of said gear element and said mirror.

5. The display system of claim 4, wherein said display screen is mounted at said base plate via a display holder that is pivotally attached at said base plate.

6. The display system of claim 5, wherein said display holder clips onto said base plate to allow for pivotal movement of said display holder and said display screen relative to said base plate.

7. The display system of claim 1, wherein said heat dissipating portion of said cooling body comprises a plurality of fins that extend inward toward a center of the passageway of said cooling housing.

8. The display system of claim 1, wherein said backlight comprises a plurality of light emitting diodes.

9. The display system of claim 1, wherein said cooling housing comprises a cylindrical housing.

10. The display system of claim 9, wherein the terminal ends of said heat plate are disposed between a respective portion of said heat dissipating portion of said cooling body and the wall of said cooling housing.

11. The display system of claim 10, wherein said heat plate circumscribes a portion of an inner surface of the wall of said cooling housing in a zigzag configuration.

12. The display system of claim 1, wherein the terminal ends of said heat plate are received in respective slots of said heat dissipating portion of said cooling body.

13. The display system of claim 1, wherein said cooling device comprises a fan disposed in the passageway of said cooling housing and circumscribed by said heat plate and said heat dissipating portion of said cooling body.

14. A display system of a vehicle, said display system comprising:
   a display device disposed in a vehicle and operable to display heads up information for viewing by a driver of the vehicle;
   said display device comprising a mirror, a display screen and a cooling device;
   wherein said display screen comprises a backlit display screen that is backlit by a backlight;
   wherein said mirror is pivotally mounted at a base plate and is pivotable via a pin of a mounting arm of said mirror moving along a spiral groove of a gear element when said gear element is rotated;
   wherein said cooling device comprises a cooling body received at a cooling housing attached at said backlight of said display screen, wherein said cooling body draws heat from said backlight of said display screen;

wherein said cooling device comprises a heat plate disposed in said cooling housing and in thermal connection with said cooling body;

wherein said heat plate circumscribes at least a portion of an inner surface of said cooling housing in a zigzag configuration; and wherein said cooling device comprises a fan disposed in said cooling housing and circumscribed by said heat plate and a portion of said cooling body.

15. The display system of claim 14, wherein said pin is urged towards a radially inward side wall of said spiral groove to limit play of said mirror relative to said base plate.

16. The display system of claim 14, wherein said gear element is tensioned in one direction to maintain engagement with the teeth of a drive gear that is driven by a motor to rotate said gear element to limit play of said gear element and said mirror.

17. The display system of claim 14, wherein said backlight comprises a plurality of light emitting diodes.

18. The display system of claim 14, wherein opposite ends of said heat plate are received in respective slots of said cooling body.

19. A display system of a vehicle, said display system comprising:
 a display device disposed in a vehicle and operable to display heads up information for viewing by a driver of the vehicle;
 said display device comprising a mirror, a display screen and a cooling device;
 wherein said mirror is pivotally mounted at a base plate and is pivotable via a pin of a mounting arm of said mirror moving along a spiral groove of a gear element when said gear element is rotated;
 wherein said display screen is mounted at said base plate via a display holder that is pivotally attached at said base plate;
 wherein said pin is urged towards a side wall of said spiral groove to limit play of said mirror relative to said base plate;
 wherein said pin is radially urged towards a side wall of said spiral groove via a spring disposed between said base plate and said mounting arm;
 wherein said cooling device comprises a cooling body received at a cooling housing attached at said display screen, wherein said cooling body draws heat from said display screen;
 wherein said cooling device comprises a heat plate disposed in said cooling housing and in thermal connection with said cooling body;
 wherein said heat plate circumscribes at least a portion of an inner surface of said cooling housing in a zigzag configuration;
 wherein opposite ends of said heat plate are received in respective slots of said cooling body; and
 wherein said cooling device comprises a fan disposed in said cooling housing and circumscribed by said heat plate and a portion of said cooling body.

20. The display system of claim 19, wherein said gear element is tensioned in one direction to maintain engagement with the teeth of a drive gear that is driven by a motor to rotate said gear element to limit play of said gear element and said mirror.

\* \* \* \* \*